US009105187B2

(12) United States Patent
Aliakseyeu et al.

(10) Patent No.: US 9,105,187 B2
(45) Date of Patent: Aug. 11, 2015

(54) METHOD AND APPARATUS FOR PROVIDING INFORMATION ABOUT THE SOURCE OF A SOUND VIA AN AUDIO DEVICE

(75) Inventors: Dzmitry Viktorovich Aliakseyeu, Eindhoven (NL); Igor Berezhnoy, Eindhoven (NL)

(73) Assignee: WOOX INNOVATIONS BELGIUM N.V., Anderlecht (BE)

( * ) Notice: Subject to any disclaimer, the term of this patent is extended or adjusted under 35 U.S.C. 154(b) by 329 days.

(21) Appl. No.: 13/320,107

(22) PCT Filed: Apr. 29, 2010

(86) PCT No.: PCT/IB2010/051874
§ 371 (c)(1), (2), (4) Date: Nov. 11, 2011

(87) PCT Pub. No.: WO2010/131144
PCT Pub. Date: Nov. 18, 2010

(65) Prior Publication Data

US 2012/0071997 A1 Mar. 22, 2012

(30) Foreign Application Priority Data

May 14, 2009 (EP) .................................... 09160267

(51) Int. Cl.

| | |
|---|---|
| ***H03G 3/20*** | (2006.01) |
| ***H03G 3/00*** | (2006.01) |
| ***G08G 1/0965*** | (2006.01) |
| ***H03G 3/32*** | (2006.01) |
| *H03G 3/24* | (2006.01) |

(52) U.S. Cl.
CPC ............... *G08G 1/0965* (2013.01); *H03G 3/32* (2013.01); *H03G 3/24* (2013.01)

(58) Field of Classification Search
CPC ......... H03G 3/32; H03G 3/342; H03G 3/344; H03G 3/345; H03G 3/34; H03G 3/24; H04R 1/1083
USPC ........ 700/94; 381/74, 57, 104–105, 107–109, 381/61
See application file for complete search history.

(56) References Cited

U.S. PATENT DOCUMENTS

| | | | | |
|---|---|---|---|---|
| 5,727,070 | A * | 3/1998 | Coninx | 381/321 |
| 5,802,180 | A * | 9/1998 | Abel et al. | 381/17 |
| 7,415,117 | B2 * | 8/2008 | Tashev et al. | 381/92 |
| 7,903,825 | B1 * | 3/2011 | Melanson | 381/57 |
| 7,903,826 | B2 * | 3/2011 | Boersma | 381/57 |
| 2002/0150254 | A1 * | 10/2002 | Wilcock et al. | 381/1 |
| 2002/0150256 | A1 * | 10/2002 | Belrose et al. | 381/17 |
| 2002/0154179 | A1 * | 10/2002 | Wilcock et al. | 345/978 |
| 2002/0165466 | A1 * | 11/2002 | Givens et al. | 600/559 |
| 2002/0186129 | A1 * | 12/2002 | Rebello | 340/540 |
| 2003/0227476 | A1 * | 12/2003 | Wilcock et al. | 345/727 |

(Continued)

*Primary Examiner* — Xu Mei
(74) *Attorney, Agent, or Firm* — Ryan Kromholz & Manion, S.C.

(57) ABSTRACT

A method and apparatus for providing information about the source of a sound via an audio device is described. An ambient sound is detected (200) and specific sounds are identified in the detected ambient sound (202). Information about the source of the identified specific sounds is determined (204). An operational control characteristic of a generated audio stream rendered by an audio device is changed (206) and information about the source is provided to the audio device upon detection of said identified specific sounds (208).

11 Claims, 2 Drawing Sheets

(56) References Cited

U.S. PATENT DOCUMENTS

2005/0195988 A1* 9/2005 Tashev et al. .................. 381/92
2006/0072764 A1* 4/2006 Mertens et al. ................. 381/56
2006/0100866 A1* 5/2006 Alewine et al. ............... 704/226
2007/0127879 A1* 6/2007 Frank et al. ..................... 386/46
2007/0185601 A1* 8/2007 Lee et al. ........................ 700/94
2007/0189544 A1* 8/2007 Rosenberg ...................... 381/57
2007/0223717 A1* 9/2007 Boersma ......................... 381/74
2008/0130908 A1* 6/2008 Cohen et al. ................. 381/71.1
2008/0187148 A1* 8/2008 Itabashi et al. ............... 381/71.6
2009/0062687 A1* 3/2009 Givens et al. ................. 600/559
2009/0179774 A1* 7/2009 Mohan et al. ................. 340/902
2009/0232325 A1* 9/2009 Lundquist ....................... 381/74
2009/0290718 A1* 11/2009 Kahn et al. ...................... 381/57
2010/0114344 A1* 5/2010 Hannaby ......................... 700/94

* cited by examiner

METHOD AND APPARATUS FOR PROVIDING INFORMATION ABOUT THE SOURCE OF A SOUND VIA AN AUDIO DEVICE

FIELD OF THE INVENTION

The present invention relates to a method and apparatus for providing information about the source of a sound via an audio device.

BACKGROUND OF THE INVENTION

Audio devices are extremely popular and are widely used. Examples of audio devices include CD players, MP-3 players, car audio systems, etc, and can also be considered to include visual devices that output audio, for example, DVD players, MPEG players, mobile phones, pagers, personal digital assistants, electronic organizers, etc. Most of these audio devices are now equipped with noise cancellation systems that cancel environmental noise from the received signals to allow a user to enjoy perfect sound quality.

However, naturally, hearing sense is very important to a person in order for them to navigate safely around their surrounding environment. When a user is listening to audio, for example via headphones, environmental noise is often cancelled. By cancelling environmental noise, important (and often life-vital) sounds are also cancelled, leaving the user to rely mostly on his visual senses whilst the audio that they are listening to via the headphones does not correspond to the situation around the user. This can lead to dangerous situations that could risk the life of a user. For example, in a situation where a user is crossing a road on a green light and there is an ambulance approaching at high speed, the user would not hear the siren of the ambulance and would be unaware of the danger.

There is therefore a need for a system that provides a user with superior quality sound while not compromising the user's safety.

A number of solutions have been proposed based on the recognition of a sudden change of environmental sound level (dB). These systems react on any sudden change in environmental sounds by stopping the audio playback so that environmental sounds can be heard. However, this is not practical when an audio device is used in a busy city as the system would be constantly triggered by the very dense audio environment.

Another solution not only reacts on the basis of sound level, but also recognizes the type of sound (for example, a car horn) and stops the audio play back based on that information.

However, by simply stopping the audio playback, a user only really knows that something has just happened (or is happening) and is not aware of what has happened and where relative to them. This is problematic when the user is in a dangerous situation as it prevents the user from acting quickly to avoid a potential danger. Also, if the audio playback was stopped due to another person calling the user's name, a user would still only be aware that something has happened and would not realise that that his name had been called. It is therefore not enough to only know that something has just happened (or is happening), but it is also important to know what happened and where relative to the user.

US 2007/0223717 discloses a headset for reproducing audio that also preserves the spatial characteristics of the ambient sound (e.g. the direction from which the ambient sound originates). This headset includes an input that receives an audio signal from electronic equipment and at least one microphone that receives ambient sound, which is converted to an ambient sound signal. The audio signal and the ambient sound signal are combined and the combined signal is provided to at least one earpiece of the headset such that the headset reproduces the ambient sound in combination with audio from the audio signal. A user of the headphones is able to adjust the ratio by which the audio signal and the ambient sound signal are combined and is able to adjust the volume of the combined signals.

However, by combining the ambient sound signal with the audio signal, the quality of the audio signal is continually affected, which would spoil the enjoyment for the user listening to the audio. To improve the quality of the audio signal, the user could choose to block most or all of the environmental sounds. However, this solution would then fail to alert the user of a potentially interesting or potentially dangerous situation.

There is therefore a need for a system that can increase the awareness of a user of an audio device to certain environmental sounds whilst maintaining the quality of the audio.

SUMMARY OF THE INVENTION

The present invention seeks to provide a method and apparatus whereby the awareness of a user of an audio device to certain environmental sounds is increased whilst the quality of the audio being played by the audio device is maintained.

This is achieved, according to one aspect of the present invention, by a method for providing information about the source of a sound via an audio device, the method comprising the steps of: detecting ambient sound; identifying specific sounds in the detected ambient sound; determining information about the source of the identified specific sounds; changing an operational control characteristic of a generated audio stream rendered by an audio device upon detection of the identified specific sounds; and providing information about the source of the identified specific sounds to the audio device.

This is also achieved, according to a second aspect of the present invention, by apparatus for providing information about the source of a sound via an audio device, the apparatus comprising: a detector for detecting ambient sound; a signal processor for identifying specific sounds in the detected ambient sound and for determining information about the source of the identified specific sounds; a controller for changing an operational control characteristic of a generated audio stream rendered by an audio device upon detection of the identified specific sounds; and an output for providing information about the source of the identified specific sounds to the audio device.

In this way, by identifying specific sounds and by only changing an operational control characteristic of a generated audio stream rendered by an audio device upon detection of the identified specific sounds, the method and apparatus is capable of detecting and selectively reacting on a limited set of predefined sounds that are important to a user. Consequently, a user is made continuously aware of important situations that are happening around him as they develop, even if the situation is occurring outside his field of view. Moreover, the quality of the audio stream is maintained. Furthermore, information about the source of the identified specific sounds is provided to the audio device such that a user can be made aware of what has happened and where.

The step of determining information about the source of the identified specific sounds may comprise determining the direction said identified specific sounds travel from their source, and the step of providing information about the source of the identified specific sounds may comprise providing the direction said identified specific sounds travel from their source.

In this way, a user is provided with the direction from which a particular sound is coming from. This is important in that the user can avoid what may have otherwise been a dangerous situation.

The step of determining information about the source of the identified specific sounds may further comprise determining the distance from said source, and the step of providing information about the source of the identified specific sounds may further comprise providing the distance from the source.

In this way, a user is made aware of his proximity to the potentially dangerous situation.

The information about the source of the identified specific sounds may be provided via the audio device using (3D) positional audio.

The step of changing an operational control characteristic of a generated audio stream rendered by an audio device may comprise lowering the volume of a generated audio stream rendered by an audio device upon detection of the identified specific sounds.

Alternatively, the step of changing an operational control characteristic of a generated audio stream rendered by an audio device may comprise pausing a generated audio stream rendered by an audio device upon detection of the identified specific sounds.

The step of providing information about the source of the identified specific sounds may comprise the step of providing an audio indication upon detection of the identified specific sounds via the audio device.

This means that a user can be provided with an indication as to why the audio stream was paused or why the volume was changed.

The audio indication may be one of a reproduction of the detected specific sounds or an electrically generated sound.

In this way, vital sounds can be detected and selectively replayed.

In addition, the method may further comprise the step of providing a visual indication upon detection of the identified specific sounds via the audio device.

This means that surrounding people can be made aware of how much the user of the audio device can hear from the surrounding environment. By increasing the awareness of surrounding people, the user of the audio device is provided with a much safer environment as the surrounding people might warn the user about a dangerous situation.

The audio device may be one of a headphone, a CD player, a DVD player, an MPEG player, an MP-3 player, a TV, a mobile phone, a pager, a personal digital assistant, an electronic organizer, or a car audio system.

BRIEF DESCRIPTION OF THE DRAWINGS

For a better understanding of the invention, and to show more clearly how it may be carried into effect, reference will now be made, by way of example only, to the accompanying drawings in which.

DETAILED DESCRIPTION

Figure 1:
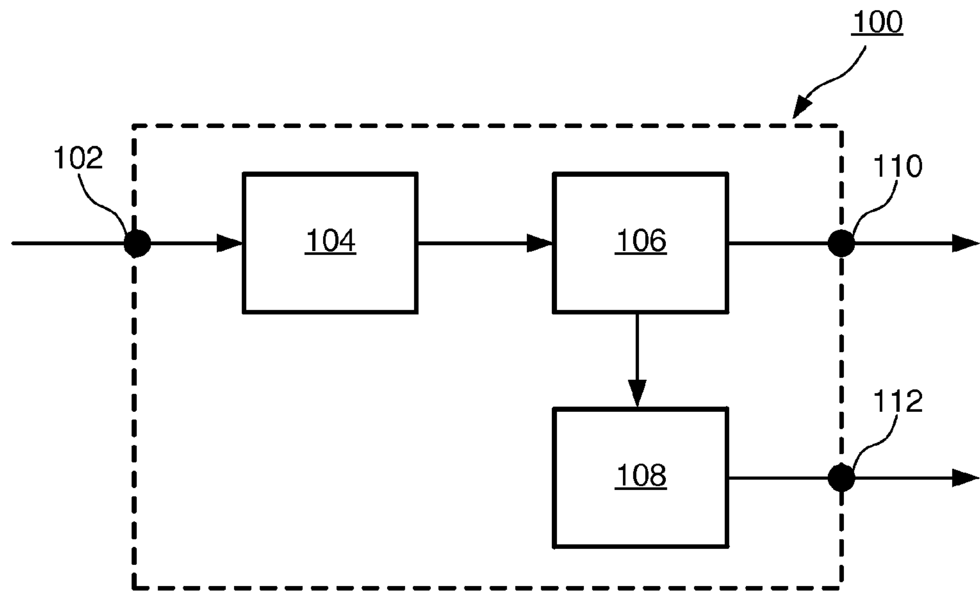
FIG. 1 is a simplified schematic of apparatus for providing information about the source of a sound via an audio device in accordance with the invention.
Figure 2:
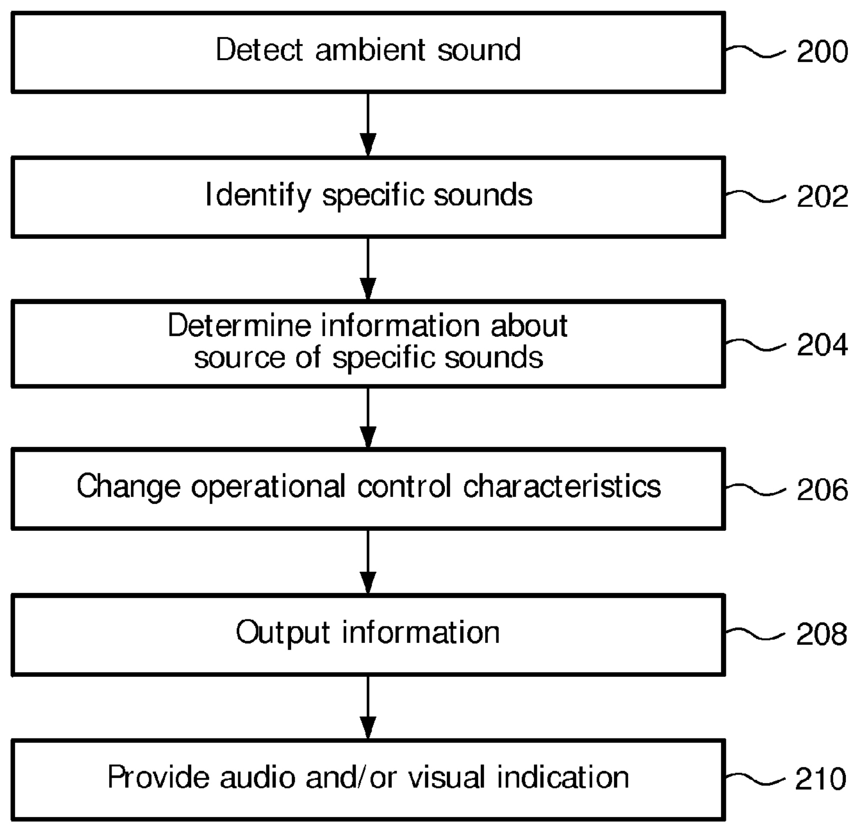
FIG. 2 is a flowchart of a method for providing information about the source of a sound via an audio device in accordance with the invention.

With reference to FIG. 1, the apparatus 100 comprises a detector 104 for detecting ambient sound via an input terminal 102. The output of the detector 104 is connected to the input of a signal processor 106 and the output of the signal processor 106 is connected to a first output terminal 110. The output of the signal processor 106 is also connected to a controller 108. The controller 108 is in communication with an audio device via a second output terminal 112.

The apparatus 100 is used in conjunction with an audio device. For example, a headphone, a CD player, a DVD player, an MPEG player, an MP-3 player, a TV, a mobile phone, a pager, a personal digital assistant, an electronic organizer, or a car audio system. The apparatus 100 may either be integrated into the audio device or separately connected to the audio device.

The detector 104 detects ambient sound via the input terminal 102 and transfers the detected ambient sound to the signal processor 106 (step 200). The signal processor 106 identifies specific sounds in the detected ambient sound (step 202). For example, the signal processor 106 identifies specific sounds in the detected ambient sound based on extracting audio features that are present in the detected ambient sound and comparing the extracted audio features with sets of audio features that have been previously stored by the apparatus 100. The previously stored sets of audio features relate to specific sounds that the apparatus 100 is required to recognise, for example, the specific sounds may be a horn, a siren, the name of the user, etc. If the signal processor 106 determines that an extracted audio feature matches an audio feature that has been stored by the apparatus 100, the signal processor 106 recognises that the specific sound is present in the detected ambient sound. A user can train the apparatus 100 to recognise further specific sounds. For example, if a user requires a new specific word to be recognised by the apparatus 100, the user can repeat the specific word several times to enable the apparatus 100 to store that specific word and extract and store features that are specific to that word. Thereafter, the signal processor 106 will identify that word in the detected ambient sound.

The signal processor 106 determines information about the source of the identified specific sounds (step 204). For example, the signal processor 106 determines the direction that the identified specific sounds travel from their source. Alternatively, or in addition, the signal processor 106 determines the distance from the source.

The signal processor 106 transfers the identified specific sounds to the controller 108. When the controller 108 receives an identified specific sound, the controller 108 changes, via the second output terminal 112, an operational control characteristic of an audio stream rendered by an audio device to which the apparatus 100 is connected or in which the apparatus 100 is integrated (step 206). For example, the controller 108 lowers the volume of the audio stream upon receiving an identified specific sound. Alternatively, the controller 108 pauses the audio stream upon receiving an identified specific sound.

The signal processor 106 provides the information that was determined about the source of the identified specific sounds to the audio device via the first output terminal 110 (step 208). For example, the signal processor 106 provides the determined direction that the identified specific sounds travel from their source and/or the determined distance from the source.

One way in which the signal processor 106 provides the information to the audio device is by providing, via the first output terminal 110, an audio indication to be played by the audio device (step 210). The audio indication may be, for example, a reproduction of the identified specific sound. In this way, when a specific sound is recognised, the audio stream (e.g. music, video etc) is paused or the volume of the audio stream is lowered and at the same time, the identified specific sound is replayed as an echo to the user. This means that the user receives information as to why the audio stream was paused, or the volume lowered. A user will therefore be made aware of a potentially interesting or dangerous situation.

The information that the signal processor 106 provides to the audio device includes the determined direction that the identified specific sounds travel from their source (and optionally the determined distance from the source). The signal processor 106 may provide the determined direction by playing the reproduction of the identified specific sound through different speakers of the audio device. For example, in the case of headphones, if a dangerous situation was occurring to the left of the user, the reproduction of the identified specific sound would be played through the left headphone such the user would be inclined to look in that direction and thus become aware of the danger.

More accurately, the signal processor 106 provides the determined direction (and optionally the determined distance) by using 3D positional audio. In this case, the reproduction of the identified specific sound is played in such a way that it appears to come from the direction or location at which the identified specific sound was detected. The more speakers that are present on the audio device, the better the specific sound can be localized.

The audio indication may, alternatively, be an electronically generated sound. For example, the audio indication may be electronically generated speech that has previously been recorded. The electronically generated speech may include phrases such as "behind", "on the left" and so on.

When the signal processor 106 identifies a specific sound, the signal processor 106 may also provide, via the first output terminal 110, a visual indication to be displayed by the audio device (step 210). For example, in the case of headphones, it is unclear to people nearby whether the user of the headphones can hear them. This is especially true for headphones that direct the sound to the ear of a listener so that no sound can be heard outside. The visual indication works by indicating on the headphone itself whether the user of the headphones can hear sounds from the outside. For example, the visual indication on the headphones may be in the form of one or more LEDs such that when the user can hear the sound/speech from the outside, a green LED is illuminated and when the loudness of the audio being played through the headphones reaches a certain level, a red LED is illuminated. Alternatively, a light bar or any other visualisation that can reflect the loudness of the audio being played through the headphones could be used to indicate the current level of environmental audio that a user is likely to hear. In the case of a car audio system, a visual indication could be displayed on the dashboard so that surrounding people are made aware of how much the driver of the car is likely to hear from the outside environment.

The invention will now be described with reference to specific embodiments in which the invention is incorporated into example audio devices.

Figure 3:
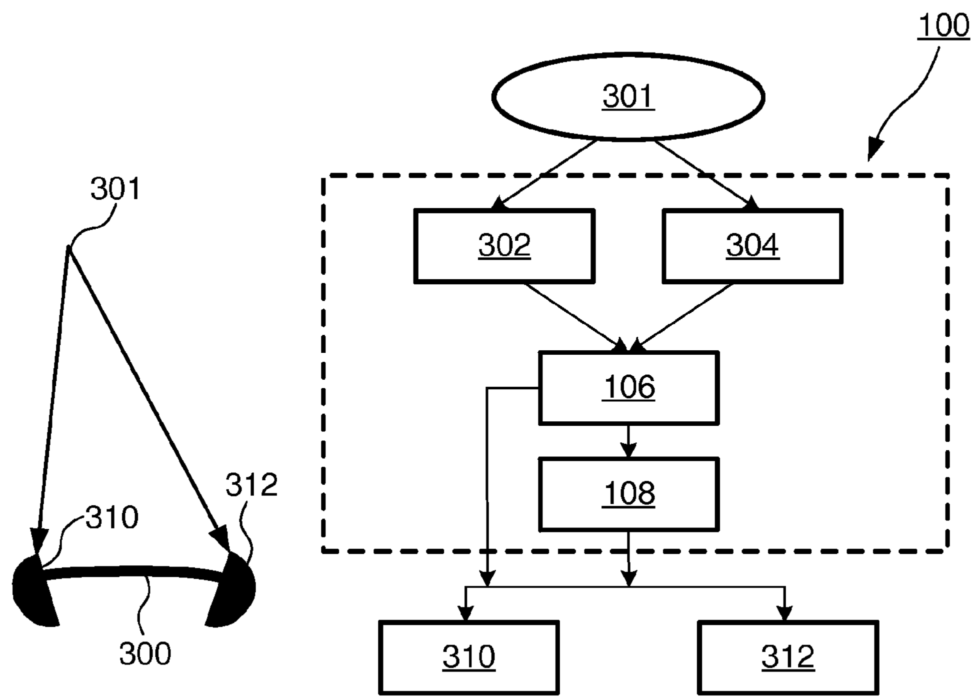
FIG. 3 is a simplified schematic of an embodiment of the invention comprising a set of headphones.

FIG. 3 shows an embodiment of the invention comprising a set of headphones 300. According to this embodiment of the invention, the detector 104 comprises a first microphone 302 and a second microphone 304. The first microphone 302 and the second microphone 304 detect environmental sound 301. The first microphone 302 and the second microphone 304 input the detected environmental sound into the signal processor 106. The signal processor 106 identifies specific sounds in the environmental sound and determines information about the source of the specific sounds. The signal processor 106 transfers the specific sounds to the controller 108 and the controller 108 changes an operational control characteristic of the audio stream being played through a first speaker 310 and a second speaker 312 of the set of headphones 300. For example, the controller 108 pauses the playback of the audio stream or lowers the volume of the audio stream. At the same time, the signal processor 106 provides the information about the source of the specific sounds via the first speaker 310 and the second speaker 312. For example, the signal processor 106 provides a reproduction of the specific signal to be played via the first speaker 310 and the second speaker 312.

Figure 4:
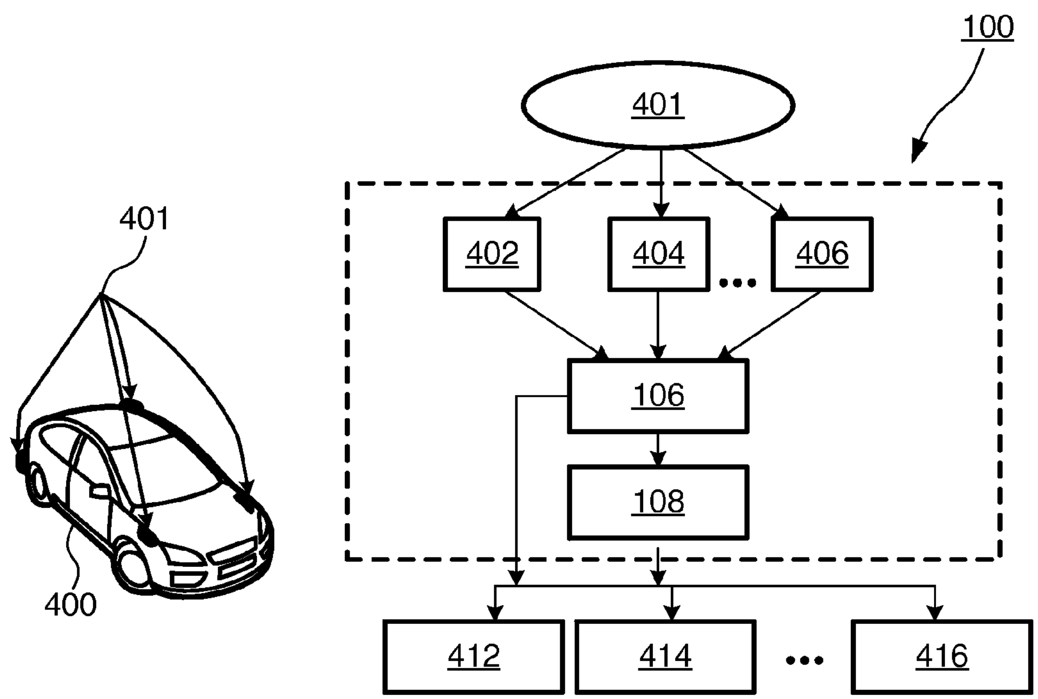
FIG. 4 is a simplified schematic of another embodiment of the invention comprising a car audio system.

FIG. 4 shows another embodiment of the invention comprising a car audio system 400. According to this embodiment of the invention, the detector 104 comprises the microphones 402, 404, 406 of the car audio system. The car audio system may have any number of microphones. The microphones 402, 404, 406 detect environmental sound 401 and each input the detected environmental sound into the signal processor 106. The signal processor 106 identifies specific sounds in the environmental sound and determines information about the source of the specific sounds. The signal processor 106 transfers the specific sounds to the controller 108 and the controller 108 changes an operational control characteristic of the audio stream being played through the speakers 412, 414, 416 of the car audio system 400. For example, the controller 108 pauses the playback of the audio stream or lowers the volume of the audio stream. At the same time, the signal processor 106 provides the information about the source of the specific sounds via the speakers 412, 414, 416. For example, the signal processor 106 provides a reproduction of the specific signal to be played via the speakers 412, 414, 416.

Although embodiments of the present invention have been illustrated in the accompanying drawings and described in the foregoing detailed description, it will be understood that the invention is not limited to the embodiments disclosed, but is capable of numerous modifications without departing from the scope of the invention as set out in the following claims.

'Means', as will be apparent to a person skilled in the art, are meant to include any hardware (such as separate or integrated circuits or electronic elements) or software (such as programs or parts of programs) which reproduce in operation or are designed to reproduce a specified function, be it solely or in conjunction with other functions, be it in isolation or in co-operation with other elements. The invention can be implemented by means of hardware comprising several distinct elements, and by means of a suitably programmed computer. In the apparatus claim enumerating several means, several of these means can be embodied by one and the same item of hardware. 'Computer program product' is to be understood to mean any software product stored on a computer-readable medium, such as a floppy disk, downloadable via a network, such as the Internet, or marketable in any other manner.

The invention claimed is:

1. A method for providing information about the source of a sound via an audio device, the method comprising the steps of:

detecting ambient sound;

identifying specific sounds in said detected ambient sound;

determining information about the source of said identified specific sounds;

determining the volume of a generated audio stream rendered by said audio device upon detection of said identified specific sounds;

changing an operational control characteristic of said generated audio stream upon detection of said identified specific sounds;

providing information about said source of said identified specific sounds to said audio device; and providing a visual indication indicative of the likelihood of there being a discernible level of said ambient sound present within said audio device based on the volume of said generated audio stream.

2. A method according to claim 1, wherein the step of determining information about the source of said identified specific sounds comprises:

determining the direction said identified specific sounds travel from their source, and wherein the step of providing information about said source of said identified specific sounds comprises:

providing the direction said identified specific sounds travel from their source.

3. A method according to claim 2, wherein the step of determining information about the source of said identified specific sounds further comprises:

determining the distance from said source, and wherein the step of providing information about said source of said identified specific sounds further comprises:

providing the distance from said source.

4. A method according to claim 1, wherein said information about said source of said identified specific sounds is provided via said audio device using positional audio.

5. A method according to claim 1, wherein the step of changing an operational control characteristic of a generated audio stream rendered by an audio device comprises:

lowering the volume of a generated audio stream rendered by an audio device upon detection of said identified specific sounds.

6. A method according to claim 1, wherein the step of changing an operational control characteristic of a generated audio stream rendered by an audio device comprises:

pausing a generated audio stream rendered by an audio device upon detection of said identified specific sounds.

7. A method according to claim 1, wherein the step of providing information about said source of said identified specific sounds comprises the step of:

providing an audio indication upon detection of said identified specific sounds via said audio device.

8. A method according to claim 7, wherein said audio indication is one of a reproduction of said detected specific sounds or an electrically generated sound.

9. A machine programmed to operate in accordance with the methods according to anyone of the preceding claims.

10. Apparatus (100) for providing information about the source of a sound via an audio device, the apparatus comprising:

a detector (104) for detecting ambient sound;

a signal processor (106) for identifying specific sounds in said detected ambient sound, for determining information about the source of said identified specific sounds, and for monitoring the volume of a generated audio stream rendered by said audio device upon detection of said identified specific sounds;

a controller (108) for changing an operational control characteristic of said generated audio stream rendered by an audio device upon detection of said identified specific sounds; and an output (110) for providing information about said source of said identified specific sounds to said audio device and for providing a visual indication indicative of the likelihood of there being a discernible level of said ambient sound present within said audio device based on the volume of said generated audio stream.

11. Apparatus according to claim 10, wherein said audio device is one of a headphone, a CD player, a DVD player, an MPEG player, an MP-3 player, a TV, a mobile phone, a pager, a personal digital assistant, an electronic organizer, or a car audio system.

* * * * *